(12) United States Patent
Bedell et al.

(10) Patent No.: US 9,040,392 B2
(45) Date of Patent: May 26, 2015

(54) METHOD FOR CONTROLLED REMOVAL OF A SEMICONDUCTOR DEVICE LAYER FROM A BASE SUBSTRATE

(75) Inventors: Stephen W. Bedell, Wappingers Falls, NY (US); Cheng-Wei Cheng, White Plains, NY (US); Devendra K. Sadana, Pleasantville, NY (US); Kuen-Ting Shiu, White Plains, NY (US); Norma E. Sosa Cortes, New York, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 355 days.

(21) Appl. No.: 13/161,260

(22) Filed: Jun. 15, 2011

(65) Prior Publication Data

US 2012/0322244 A1    Dec. 20, 2012

(51) Int. Cl.
| | |
|---|---|
| *H01L 21/36* | (2006.01) |
| *H01L 21/18* | (2006.01) |
| *H01L 21/78* | (2006.01) |
| *H01L 21/02* | (2006.01) |
| *H01L 31/18* | (2006.01) |

(52) U.S. Cl.
CPC .......... *H01L 21/187* (2013.01); *H01L 21/7813* (2013.01); *H01L 21/02002* (2013.01); *H01L 31/1892* (2013.01); *Y02E 10/50* (2013.01)

(58) Field of Classification Search
CPC ............... H01L 31/1892; H01L 21/76259; H01L 21/76251
USPC .................................................. 438/458, 478
See application file for complete search history.

(56) References Cited

U.S. PATENT DOCUMENTS

| | | | | |
|---|---|---|---|---|
| 4,445,965 | A | * | 5/1984 | Milnes ............................ 438/95 |
| 4,888,666 | A | * | 12/1989 | Naitoh et al. ................. 361/512 |
| 5,665,607 | A | | 9/1997 | Kawama et al. |
| 5,811,348 | A | * | 9/1998 | Matsushita et al. ........... 438/455 |
| 6,100,166 | A | * | 8/2000 | Sakaguchi et al. ............ 438/455 |
| 6,306,729 | B1 | * | 10/2001 | Sakaguchi et al. ............ 438/458 |
| 6,802,926 | B2 | * | 10/2004 | Mizutani et al. .............. 156/247 |
| 7,875,531 | B2 | * | 1/2011 | Dross et al. ................... 438/458 |
| 2006/0246688 | A1 | | 11/2006 | Sekiguchi et al. |
| 2010/0311250 | A1 | | 12/2010 | Bedell et al. |

FOREIGN PATENT DOCUMENTS

WO    WO2009061353    5/2009

OTHER PUBLICATIONS

European Search Report dated Aug. 6, 2012 received in a corresponding foreign application.

* cited by examiner

*Primary Examiner* — Alexander Ghyka
(74) *Attorney, Agent, or Firm* — Scully, Scott, Murphy & Presser, P.C.; Louis J. Percello, Esq.

(57) ABSTRACT

A method of removing a semiconductor device layer from a base substrate is provided that includes providing a crack propagation layer on an upper surface of a base substrate. A semiconductor device layer including at least one semiconductor device is formed on the crack propagation layer. Next, end portions of the crack propagation layer are etched to initiate a crack in the crack propagation layer. The etched crack propagation layer is then cleaved to provide a cleaved crack propagation layer portion to a surface of the semiconductor device layer and another cleaved crack propagation layer portion to the upper surface of the base substrate. The cleaved crack propagation layer portion is removed from the surface of the semiconductor device layer and the another cleaved crack propagation layer portion is removed from the upper surface of the base substrate.

17 Claims, 7 Drawing Sheets

METHOD FOR CONTROLLED REMOVAL OF A SEMICONDUCTOR DEVICE LAYER FROM A BASE SUBSTRATE

BACKGROUND

The present disclosure relates to semiconductor device manufacturing, and more particularly to methods for controlled removal of a semiconductor device layer from a base substrate in which, after the removal of the semiconductor device layer from the base substrate, the base substrate has a planar surface and thus can be reused.

Devices that can be produced in thin-film form have three clear advantages over their bulk counterparts. First, by virtue of less material used, thin-film devices ameliorate the materials cost associated with device production. Second, low device weight is a definite advantage that motivates industrial-level effort for a wide range of thin-film applications. Third, if dimensions are small enough, devices can exhibit mechanical flexibility in their thin-film form. Furthermore, if a device layer is removed from a substrate that can be reused, additional fabrication cost reduction can be achieved.

Efforts to (i) create thin-film substrates from bulk materials (i.e., semiconductors) and (ii) form thin-film device layers by removing device layers from the underlying bulk substrates on which they were formed are ongoing. The controlled surface layer removal required for such applications has been successfully demonstrated using a process known as spalling; see U.S. Patent Application No. 2010/0311250 to Bedell et al. Spalling includes depositing a stressor layer on a base substrate, placing an optional handle substrate on the stressor layer, and inducing a crack and its propagation below the base substrate/stressor interface. This process, which is performed at room temperature, removes a thin layer of the base substrate below the stressor layer. By thin, it is meant that the layer thickness is typically less than 100 microns, with a layer thickness of less than 50 microns being more typical.

The depth of at which the crack propagates is dictated by the thickness of the stressor layer, the inherent tensile stress of the stressor layer, and the fracture toughness of the base substrate being exfoliated (spalled). However, control of the initiation of the release layer process (crack initiation and propagation) is not easy. Moreover, the spalled surface is usually not flat and hence, the base substrate cannot be reused, which increases manufacturing cost.

SUMMARY

In one embodiment, a method of controlling the removal of a semiconductor device layer from a base substrate is provided that includes providing a crack propagation layer on an upper surface of a base substrate. A semiconductor device layer including at least one semiconductor device is formed on the crack propagation layer. Next, end portions of the crack propagation layer are etched to initiate a crack in the crack propagation layer. The etched crack propagation layer is then cleaved to provide a cleaved crack propagation layer portion to a surface of the semiconductor device layer and another cleaved crack propagation layer portion to the upper surface of the base substrate. The cleaved crack propagation layer portion is removed from the surface of the semiconductor device layer and the another cleaved crack propagation layer portion is removed from the upper surface of the base substrate.

In another embodiment, a method of controlling the removal of a semiconductor device layer from a base substrate is provided that includes providing a sacrificial structure on an upper surface of a base substrate. The sacrificial structure comprises, from bottom to top, a first confinement layer, a crack propagation layer, and a second confinement layer. A semiconductor device layer including at least one semiconductor device is formed on the second confinement layer of the sacrificial structure. End portions of the crack propagation layer are then etched to initiate a crack in the crack propagation layer of the sacrificial structure. The etched crack propagation layer is thereafter cleaved to provide a cleaved crack propagation layer portion to a surface of second confinement layer that is located on a surface of the semiconductor device layer and another cleaved crack propagation layer portion to a surface of the first confinement layer that is located on the upper surface of the base substrate. The cleaved crack propagation layer portion is removed from the surface of the second confinement layer that is located on the surface of the semiconductor device layer and the another cleaved crack propagation layer portion is removed from the surface of the first confinement layer that is located on the upper surface of the base substrate. Next, the first confinement layer is removed from the upper surface of the base substrate and second confinement layer is removed from the surface of the semiconductor device layer.

DETAILED DESCRIPTION

The present disclosure, which relates to methods for controlled removal of a semiconductor device layer from a base substrate in which, after the removal of the semiconductor device layer from the base substrate, the base substrate has a planar surface and thus can be reused, will now be described in greater detail by referring to the following discussion and drawings that accompany the present application. It is noted that the drawings of the present application are provided for illustrative purposes and, as such, they are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the present disclosure may be practiced with viable alternative process options without these specific details. In other instances, well-known structures or processing steps have not been described in detail in order to avoid obscuring the various embodiments of the present disclosure.

It will be understood that when an element as a layer, region, or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Reference is first made to FIGS. 1-8 which illustrate one embodiment of the present disclosure. In the embodiment illustrated in FIGS. 1-8, a crack propagation layer is sandwiched between a semiconductor device layer and a base substrate. The crack propagation layer can be etched to initiation crack formation in the crack propagation layer. The etched crack propagation layer can then be cleaved and thereafter the cleaved portions of the etched propagation layer that are present on the semiconductor device layer and the base substrate can be removed by etching. Once the cleaved portion of the etched propagation layer has been removed from the surface of the base substrate, the base substrate which has a substantially planar, flat surface can be reused since the crack initiation and propagation occurred in the crack propagation layer not within the base substrate.

Figure 1:
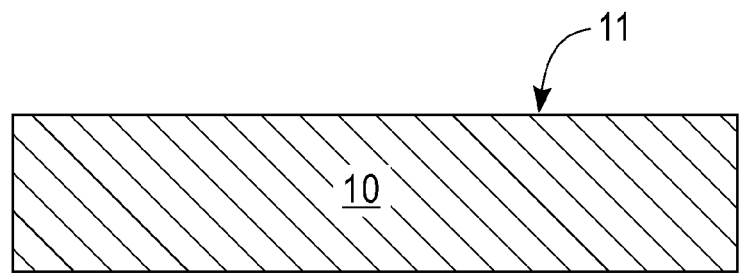
FIG. 1 is a pictorial representation (through a cross sectional view) illustrating an initial base substrate that can be employed in one embodiment of the present disclosure.

Referring first to FIG. 1 there is illustrated a base substrate 10 having an upper surface 11 that can be employed in the present disclosure. The base substrate 10 employed in the present disclosure may comprise a semiconductor material, a glass, a ceramic, or any another material whose fracture toughness is greater than that of the crack propagation layer to be subsequently formed.

Fracture toughness is a property which describes the ability of a material containing a crack to resist fracture. Fracture toughness is denoted $K_{Ic}$. The subscript Ic denotes mode I crack opening under a normal tensile stress perpendicular to the crack, and c signifies that it is a critical value. Mode I fracture toughness is typically the most important value because spalling mode fracture usually occurs at a location in the substrate where mode II stress (shearing) is zero, and mode III stress (tearing) is generally absent from the loading conditions. Fracture toughness is a quantitative way of expressing a material's resistance to brittle fracture when a crack is present.

When the base substrate 10 comprises a semiconductor material, the semiconductor material may include, but is not limited to, Si, Ge, SiGe, SiGeC, SiC, Ge alloys, GaSb, GaP, GaAs, InAs, InP, and all other III-V or II-VI compound semiconductors. In some embodiments, the base substrate 10 is a bulk semiconductor material. In other embodiments, the base substrate 10 may comprise a layered semiconductor material such as, for example, a semiconductor-on-insulator or a semiconductor on a polymeric substrate. Illustrated examples of semiconductor-on-insulator substrates that can be employed as base substrate 10 include silicon-on-insulators and silicon-germanium-on-insulators.

When the base substrate 10 comprises a semiconductor material, the semiconductor material can be doped, undoped or contain doped regions and undoped regions.

In one embodiment, the semiconductor material that can be employed as the base substrate 10 can be single crystalline (i.e., a material in which the crystal lattice of the entire sample is continuous and unbroken to the edges of the sample, with no grain boundaries). In another embodiment, the semiconductor material that can be employed as the base substrate 10 can be polycrystalline (i.e., a material that is composed of many crystallites of varying size and orientation; the variation in direction can be random (called random texture) or directed, possibly due to growth and processing conditions). In yet another embodiment of the present disclosure, the semiconductor material that can be employed as the base substrate 10 can be amorphous (i.e., a non-crystalline material that lacks the long-range order characteristic of a crystal). Typically, the semiconductor material that can be employed as the base substrate 10 is a single crystalline material.

When the base substrate 10 comprises a glass, the glass can be an $SiO_2$-based glass which may be undoped or doped with an appropriate dopant. Examples of $SiO_2$-based glasses that can be employed as the base substrate 10 include undoped silicate glass, borosilicate glass, phosphosilicate glass, fluorosilicate glass, and borophosphosilicate glass.

When the base substrate 10 comprises a ceramic, the ceramic is any inorganic, non-metallic solid such as, for example, an oxide including, but not limited to, alumina, beryllia, ceria and zirconia, a non-oxide including, but not limited to, a carbide, a boride, a nitride or a silicide; or composites that include combinations of oxides and non-oxides.

In some embodiments of the present disclosure, the upper surface 11 of the base substrate 10 can be cleaned prior to further processing to remove surface oxides and/or other contaminants therefrom. In one embodiment of the present disclosure, upper surface 11 of the base substrate 10 can be cleaned by applying to the base substrate 10 a solvent such as, for example, acetone and isopropanol, which is capable of removing contaminates and/or surface oxides from the upper surface 11 of the base substrate 10.

Figure 2:
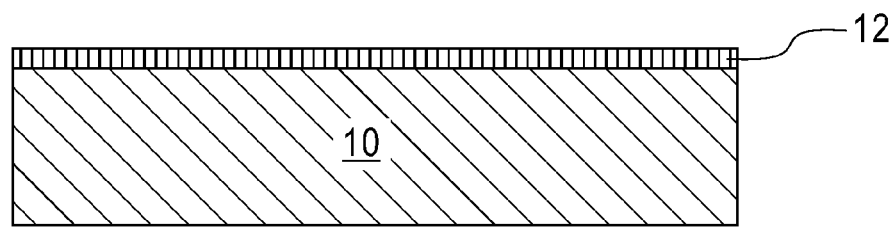
FIG. 2 is a pictorial representation (through a cross sectional view) illustrating the base substrate of FIG. 1 after forming a crack propagation layer on an upper surface of the base substrate.

Referring to FIG. 2, there is illustrated the structure of FIG. 1 after forming a crack propagation layer 12 on the upper surface 11 of the base substrate 10. The crack propagation layer 12 is a sacrificial material that is employed in the present disclosure to control the location in which crack initiation and subsequent propagation occurs. The crack propagation layer 12 includes any material having a fracture toughness that is less than the underlying base substrate 10 and less than the overlying semiconductor device layer 14 to be subsequently formed. Examples of materials that can be used as the crack propagation layer 12 include, but are not limited to, a semiconductor material such as, for example, Si, Ge, SiGe, AlAs and GaAs. In one embodiment, the crack propagation layer 12 is comprised of germanium. In another embodiment, the crack propagation layer 12 is comprised of a III-V compound semiconductor such as, for example, AlAs.

The crack propagation layer 12 can be formed utilizing techniques that are well known to those skilled in the art. In one embodiment, the crack propagation layer 12 can be formed by a physical or growth deposition process in which a semiconductor precursor is employed. In another embodiment, the crack propagation layer 12 can be formed by an epitaxial growth process. When an epitaxial growth process is employed and when the upper surface of the base substrate 10 is comprised of a semiconductor material, the crack propagation layer 12 is epitaxially aligned with the underlying surface of the base substrate 10. In yet another embodiment, the crack propagation layer 12 can be formed utilizing a layer transfer process.

The crack propagation layer 12 that is employed in the present application has a thickness that is from 0.01 μm to 10 μm, with a thickness from 1 μm to 3 μm being more typical. Other thicknesses that are above and/or below that aforementioned thickness range can also be employed as the crack propagation layer 12.

Figure 3:
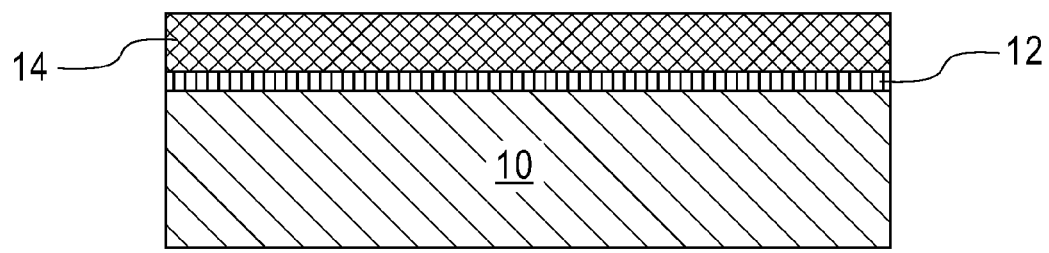
FIG. 3 is a pictorial representation (through a cross sectional view) illustrating the structure of FIG. 2 after forming a semiconductor device layer on an upper surface of the crack propagation layer.

Referring to FIG. 3, there is illustrated the structure of FIG. 2 after forming a semiconductor device layer 14 on an upper surface of the crack propagation layer 12. The semiconductor device layer 14 employed in the present disclosure comprises a semiconductor material including, but not limited to, Si, Ge, SiGe, SiGeC, SiC, Ge alloys, GaSb, GaP, GaAs, InAs, InP, and all other III-V or II-VI compound semiconductors. In some embodiments, the semiconductor device layer 14 is a bulk semiconductor material. In other embodiments, the semiconductor device layer 14 may comprise a layered semiconductor material such as, for example, a semiconductor-on-insulator or a semiconductor on a polymeric substrate.

Illustrated examples of semiconductor-on-insulator substrates that can be employed as semiconductor device layer 14 include silicon-on-insulators and silicon-germanium-on-insulators.

In some embodiments, the semiconductor device layer 14 comprises a same semiconductor material as that of the base substrate 10. In another embodiment, the semiconductor device layer 14 and the base substrate 10 comprise different semiconductor materials. In yet another embodiment, the semiconductor device layer 14 comprises a semiconductor material and the base substrate 10 comprises a non-semiconductor material such as, for example, glass or a ceramic.

The semiconductor material of the semiconductor device layer 14 can be doped, undoped or contain doped regions and undoped regions.

In one embodiment, the semiconductor material that can be employed as the semiconductor device layer 14 can be single crystalline. In another embodiment, the semiconductor material that can be employed as the semiconductor device layer 14 can be polycrystalline. In yet another embodiment of the present disclosure, the semiconductor material that can be employed as the semiconductor device layer 14 can be amorphous. Typically, the semiconductor material that can be employed as the semiconductor device layer 14 is a single crystalline material.

The semiconductor device layer 14 can be formed on an upper surface of the crack propagation layer 12 utilizing techniques that are well known to those skilled in the art. In one embodiment, the semiconductor device layer 14 can be formed atop the crack propagation layer 12 by a physical or growth deposition process in which a semiconductor precursor is employed. In another embodiment, the semiconductor device layer 14 can be formed by an epitaxial growth process. When an epitaxial growth process is employed, the semiconductor device layer 14 is epitaxially aligned with the underlying surface of the crack propagation layer 12. In yet another embodiment, the semiconductor device layer 14 can formed atop the crack propagation layer 12 utilizing a layer transfer process.

The semiconductor device layer 14 can be processed to include at least one semiconductor device including, but not limited to, a transistor, a capacitor, a diode, a BiCMOS, a resistor, a component of photovoltaic cell, a component of a solar cell, etc. In one embodiment, the at least one semiconductor device can be formed on the semiconductor device layer 14 after formation of the semiconductor device layer 14. In another embodiment, the at least one semiconductor device can be formed prior to forming the semiconductor device layer 14 on the crack propagation layer 12.

The thickness of the semiconductor device layer 14 that is employed in the present disclosure can vary depending on the type of device that is to be presented thereon. In one embodiment, the semiconductor device layer 14 has a thickness from 3 nm to 1000 nm. In another embodiment, the semiconductor device layer 14 has a thickness from 5 nm to 100 nm. Other thicknesses that are above and/or below the aforementioned ranges can also be used for the semiconductor device layer 14.

Figure 4:
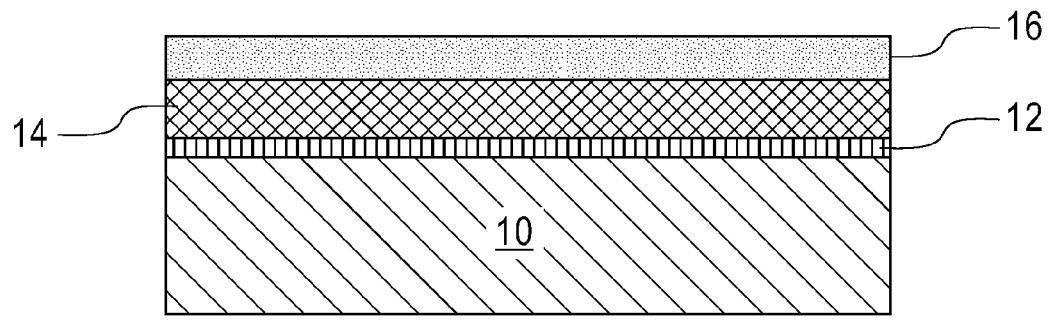
FIG. 4 is a pictorial representation (through a cross sectional view) illustrating the structure of FIG. 3 after forming a stressor layer on an upper surface of the semiconductor device layer.

Referring now to FIG. 4, there is illustrated the structure of FIG. 3 after forming a stress layer 16 on an upper surface of the semiconductor device layer 14. The stressor layer 16 employed in the present disclosure includes any material that is under tensile stress when applied atop the semiconductor device layer 14. Illustrative examples of such materials that are under tensile stress when applied atop the semiconductor device layer 14 include, but are not limited to, a metal, a polymer or any combination thereof. The stressor layer 16 may comprise a single stressor layer, or a multilayered stressor structure including at least two layers of different stressor material can be employed.

In one embodiment, the stressor layer 16 is a metal, and the metal is formed on an upper surface of the semiconductor device layer 14. When a metal is employed as the stressor layer 16, the metal can include, for example, Ni, Cr, Fe or W. Alloys of these metals can also be employed. In one embodiment, the stressor layer 16 includes at least one layer consisting of Ni.

In embodiments in which a metal stressor layer is employed, a metal-containing adhesion layer can be formed between the metal stressor layer and the semiconductor device layer 14. Examples of metal-containing adhesion layers that can be employed include, but are not limited to, Ti/W, Ti, Cr, Ni or any combination thereof. The metal-containing adhesion layer may comprise a single layer or it may include a multilayered structure comprising at least two layers of different metal adhesion materials. The metal-containing adhesion layer can be formed utilizing deposition techniques that are well known to those skilled in the art. For example, the metal-containing adhesion layer can be formed by sputtering, chemical vapor deposition, plasma enhanced chemical vapor deposition, chemical solution deposition, physical vapor deposition, and plating. When sputter deposition is employed, the sputter deposition process may further include an in-situ sputter clean process before the deposition. When employed, the metal-containing adhesion layer typically has a thickness of from 5 nm to 200 nm, with a thickness of from 100 nm to 150 nm being more typical. Other thicknesses for the metal-containing adhesion layer that are below and/or above the aforementioned thickness ranges can also be employed in the present disclosure.

When a polymer is employed as the stressor layer 16, the polymer is a large macromolecule composed of repeating structural units. These subunits are typically connected by covalent chemical bonds. Illustrative examples of polymers that can be employed as the stressor layer 16 include, but are not limited to, polyimides, polyesters, polyolefins, polyacrylates, polyurethane, polyvinyl acetate, and polyvinyl chloride.

In some embodiments, the polymer may include a spall inducing tape layer. When a spall inducing tape layer is employed as the stressor layer 16, the spall inducing tape layer includes any pressure sensitive tape that is flexible, soft, and stress free at the temperature used to form the tape, yet strong, ductile and tensile at the temperature used during cleaving. By "pressure sensitive tape," it is meant an adhesive tape that will stick with application of pressure, without the need for solvent, heat, or water for activation. Typically, the pressure sensitive tape that is employed in the present disclosure as stressor layer 16 includes at least an adhesive layer and a base layer. Materials for the adhesive layer and the base layer of the pressure sensitive tape include polymeric materials such as, for example, acrylics, polyesters, olefins, and vinyls, with or without suitable plasticizers. Plasticizers are additives that can increase the plasticity of the polymeric material to which they are added. The spall inducing tape can be formed utilizing techniques well known in the art or they can be commercially purchased from any well known adhesive tape manufacturer. Some examples of spall inducing tapes that can be used in the present disclosure as stressor layer 16 include, for example, Nitto Denko 3193MS thermal release tape, Kapton KPT-1, and Diversified Biotech's CLEAR-170 (acrylic adhesive, vinyl base).

When the stressor layer 16 is a metal or polymer, the stressor layer 16 can be formed utilizing deposition techniques that are well known to those skilled in the art including, for example, dip coating, spin-coating, brush coating, sputtering, chemical vapor deposition, plasma enhanced chemical vapor deposition, chemical solution deposition, physical vapor deposition, and plating. When the stressor layer 16 is a spall inducing tape, the spall inducing tape can be applied by hand or mechanical means to the structure.

If the stressor layer 16 is of a metallic nature, it typically has a thickness of from 3 µm to 50 µm, with a thickness of from 4 µm to 7 µm being more typical. Other thicknesses for a metallic stressor layer that are below and/or above the aforementioned thickness ranges can also be employed in the present disclosure.

If the stressor layer 16 is of a polymeric nature, it typically has a thickness of from 10 µm to 200 µm, with a thickness of from 50 µm to 100 µm being more typical. Other thicknesses for a polymeric stressor layer that are below and/or above the aforementioned thickness ranges can also be employed in the present disclosure.

Figure 5:
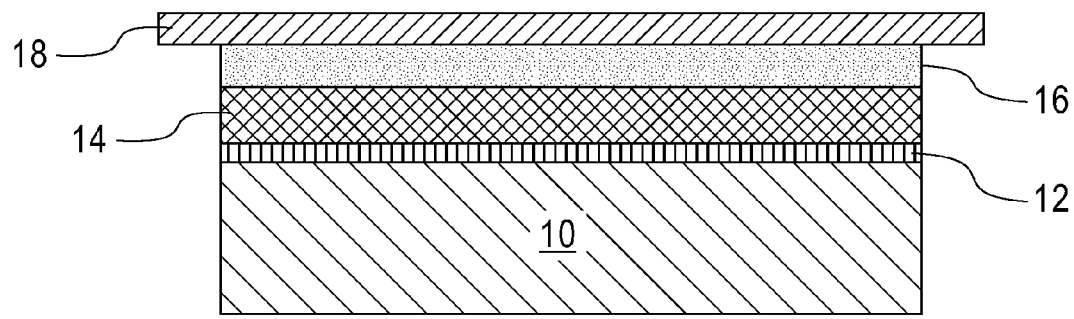
FIG. 5 is a pictorial representation (through a cross sectional view) illustrating the structure of FIG. 4 after forming a plastic sheet atop the stressor layer.

Referring to FIG. 5, there is illustrated the structure of FIG. 4 after forming a plastic sheet 18 atop the stressor layer 16. The plastic sheet 18 that can be employed in the present disclosure includes a synthetic or semi-synthetic organic film that is comprised of at least one polymer of a high molecular mass. In one embodiment, the plastic sheet 18 is comprised of a thermoplastic polymer. A thermoplastic polymer is a plastic that does not undergo chemical change in composition when heated. Examples of thermoplastic polymers that can be used as the plastic sheet 18 include, but are not limited to, polyethylene, polypropylene, polystyrene, and polyvinyl chloride.

In another embodiment, the plastic sheet 18 can be comprised of a thermosetting polymer. A thermosetting polymer is a polymer that can melt and take shape once; after it has solidified, it stays solid. That is, a thermosetting polymer is a material that irreversibly cures. Examples of thermosetting polymers that can be employed as the plastic sheet 18 include, but are not limited to, polyimides, acrylic polymers and epoxy resins.

The plastic sheet 18 can be applied to the upper surface of the stressor layer 16 by hand or by mechanical means. The plastic sheet 18 that can be employed typically has a thickness from 1 mil to 100 mils, with a thickness from 10 mils to 50 mils being more typical.

Figure 6:
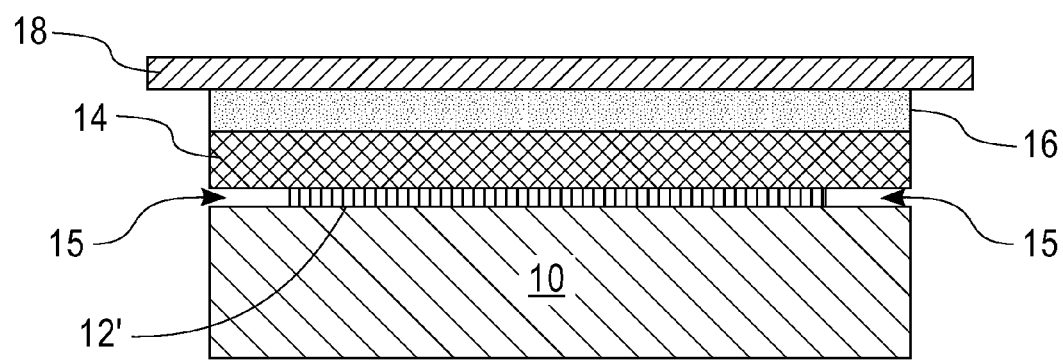
FIG. 6 is a pictorial representation (through a cross sectional view) illustrating the structure of FIG. 5 after etching the crack propagation layer to initiation crack formation in the crack propagation layer.

Referring to FIG. 6, there is illustrated the structure of FIG. 5 after etching the crack propagation layer 12 to initiation crack formation in the crack propagation layer 12. In FIG. 6, reference numeral 12' is used to denote the etched crack propagation layer, while reference numeral 15 is used to denote a crack being formed into the initial crack propagation layer 12. The etching of the crack propagation layer 12 is performed by contacting exposed end portions of the crack propagation layer 12 shown in FIG. 5 with an etchant that selectively removes end portions of the crack propagation layer 12 relative to the other elements of the structure shown in FIG. 5. In one embodiment, and when germanium is employed as the crack propagation layer 12, an etchant composed of $H_2O_2$ can be used to etch the end portions of the crack propagation layer 12.

In one embodiment, the etching of the end portions of the crack propagation layer 12 can be achieved by immersing at least a part, or all, of the structure shown in FIG. 5 into an etchant bath. In another embodiment, etching of the end portions of the crack propagation layer 12 can be performed by apply the etchant directly to the end portions of the crack propagation layer 12 using a process such as, for example, brush coating.

In one embodiment, the etching of the end portions of the crack propagation layer 12 can be performed at room temperature (i.e., a temperature from 15° C.-40° C.). In another embodiment, the etching of the end portions of the crack propagation layer 12 can be performed at a temperature from room temperature up to 150° C.

Figure 7:
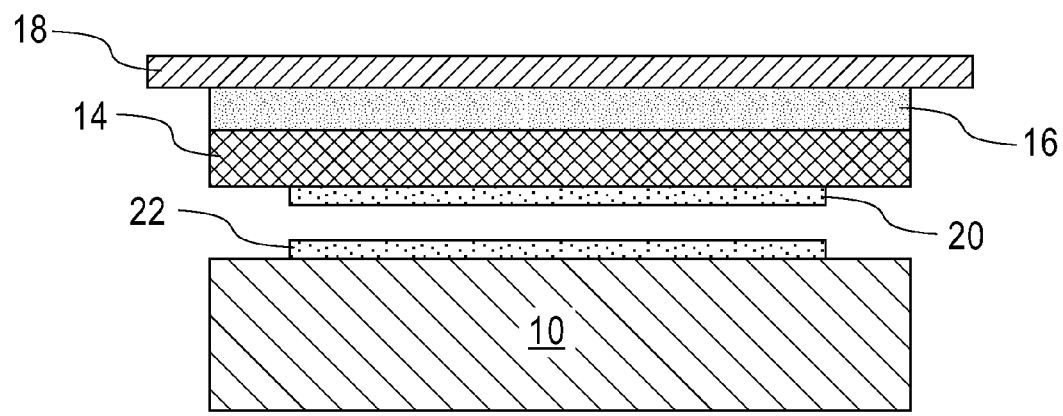
FIG. 7 is a pictorial representation (through a cross sectional view) illustrating the structure of FIG. 6 after cleaving the etched crack propagation layer to separate the semiconductor device layer from the base substrate.

Referring to FIG. 7, there is illustrated the structure of FIG. 6 after cleaving the etched crack propagation layer 12' to separate the semiconductor device layer 14 from the base substrate 10. In FIG. 7, reference numeral 20 denotes a cleaved crack propagation layer portion that remains on a surface of the semiconductor deice layer 14, while reference numeral 22 denotes another cleaved crack propagation layer portion that remains on the upper surface of the base substrate 10.

The cleaving of the etched crack propagation layer 12' is achieved by utilizing the crack 15 that was formed above and then propagating the crack by spalling.

The cleaving step is typically performed at room temperature or a temperature that is less than room temperature. In one embodiment, the cleaving is performed at a temperature from 20° C. to 40° C. In another embodiment, the cleaving can be performed at a temperature of 77 K or less. When a temperature that is less than room temperature is used, the less than room temperature cleaving process can be achieved by cooling the structure down below room temperature utilizing any cooling means. For example, cooling can be achieved by placing the structure in a liquid nitrogen bath, a liquid helium bath, an ice bath, a dry ice bath, a supercritical fluid bath, or any cryogenic environment liquid or gas. When cleaving is performed at a temperature that is below room temperature, the cleaved structures are returned to room temperature by allowing the cleaved structures to slowly cool up to room temperature by allowing the same to stand at room temperature. Alternatively, the cleaved structures can be heated up to room temperature utilizing any heating means.

The thickness of the cleaved crack propagation layer portions that remain on the base substrate 10 and the semiconductor device layer 14 may vary depending on the location of the initial crack.

Figure 8:
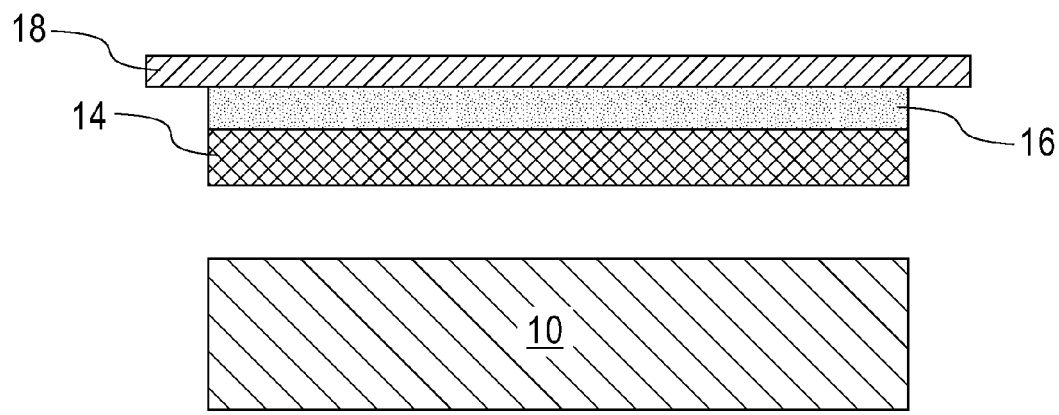
FIG. 8 is a pictorial representation (through a cross sectional view) illustrating the structure of FIG. 7 after removing portions of the crack propagation layer that remain on both the base substrate and the semiconductor device layer.

Referring to FIG. 8, there is illustrated the structure of FIG. 7 after removing portions of the crack propagation layer that remain on both the base substrate 10 and the semiconductor device layer 14. Specifically, FIG. 8 illustrates the structure that is formed after removing the cleaved crack propagation layer portion 20 from the surface of the semiconductor device layer 14 and removing the another cleaved crack propagation layer portion 22 from the upper surface of the base substrate 10. The removal of the cleaved crack propagation layer portions from the semiconductor device layer 14 and the base substrate 10 can be performed utilizing an etching process that selectively removes the cleaved crack propagation layer portions (20, 22) from the respective surfaces of the semiconductor device layer 14 and the base substrate 10. In one embodiment, the etching process can include the same etchant as used in forming the crack into the initial crack propagation layer 12. For example, and when germanium is employed as the crack propagation layer 12, an etchant composed of $H_2O_2$ can be used to remove the cleaved crack propagation layer portions (20, 22) from the respective surfaces of the semiconductor device layer 14 and the base substrate 10.

After removing the cleaved crack propagation layer portions (20, 22) from the respective surfaces of the semiconductor device layer 14 and the base substrate 10, the structure including the semiconductor device layer 14 can be furthered processed utilizing techniques well known in the art. For example, the structure including the semiconductor device layer 14 can be transferred to a handle substrate (e.g., semiconductor substrate, glass, and/or metal sheet) and then the plastic sheet 18 and the stressor layer 16 could be removed therefrom. Alternatively, the plastic sheet 18 and the stressor layer 16 could be removed prior to transferring the semiconductor device layer 14 to the handle substrate.

After the cleaved crack propagation layer portion 22 is removed from the upper surface of the base substrate 10, the base substrate 10 shown in FIG. 8 can be re-used as desired. It is noted that since crack initiation and propagation occurred in the crack propagation layer 12, not the base substrate, the base substrate 10 shown in FIG. 8 has a flat, planar surface. This is in contrast to conventional spalling disclosed in U.S. Patent Application No. 2010/0311250 to Bedell et al.

The flat, planar surface of the base substrate 10 shown in FIG. 8 has a surface roughness that is substantially the same as that of the top surface 11 of the base substrate 10 shown in FIG. 1. Typically, the top surface 11 of the base substrate 10 shown in FIG. 1 has surface roughness from 0.1 nm to 2 nm, while the surface roughness of the top surface of the base substrate 10 shown in FIG. 8 is the same or within 10% or less of that of the top surface 11 of the base substrate 10 shown in FIG. 1.

Reference now is made to FIGS. 9-18 which illustrate another embodiment of the present disclosure. The embodiment that is illustrated in FIGS. 9-18 is similar to the one depicted in FIGS. 1-8 except that the crack propagation layer is sandwiched between top and bottom confinement layers. The presence of the confinement layers provides a means to more precisely control where crack formation and propagation will occur in the crack propagation layer. This method of the present disclosure also provides a means in which after the semiconductor device layer has been removed from the base substrate, the base substrate can be reused. That is, after the semiconductor device layer has been removed from the base substrate, the base substrate has a flat planar surface having a surface roughness as described above.

Figure 9:
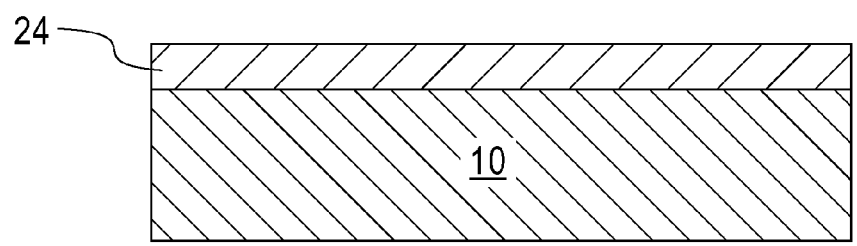
FIG. 9 is a pictorial representation (through a cross sectional view) illustrating the base substrate of FIG. 1 after forming a first confinement layer on an upper surface of the base substrate in accordance with another embodiment of the present disclosure.

Referring now to FIG. 9, there is illustrated the base substrate 10 of FIG. 1 after forming a first confinement layer 24 on the upper surface 11 of the base substrate 12 in accordance with another embodiment of the present disclosure. The base substrate 10 includes one of the materials mentioned above. The first confinement layer 24 comprises a material having a fracture toughness that is greater than that of the crack propagation layer 12 to be subsequently formed. In one embodiment, the first confinement layer 24 has a fracture toughness that is greater than that of the crack propagation layer 12, but less than that of the base substrate 10. In another embodiment, the first confinement layer 24 has a fracture toughness that is greater than that of the crack propagation layer 12, but greater than that of the base substrate 10. In yet another embodiment, the first confinement layer 24 has a fracture toughness that is greater than that of the crack propagation layer 12, but equal to that of the base substrate 10.

In one embodiment, the first confinement layer 24 may comprise a semiconductor material such as, for example, a III-V compound semiconductor such as, for example, AlAs. AlAs and related III-V compound semiconductors aid in preventing interdiffusion of matter between the base substrate 10 and the semiconductor device layer 14 to be subsequently formed.

The first confinement layer 24 can be formed utilizing techniques that are well known to those skilled in the art. In one embodiment, the first confinement layer 24 can be formed by a physical or growth deposition process in which a semiconductor precursor is employed. In another embodiment, the first confinement layer 24 can be formed by an epitaxial growth process. When an epitaxial growth process is employed and when the upper surface of the base substrate 10 is comprised of a semiconductor material, the first confinement layer 24 is epitaxially aligned with the underlying surface of the base substrate 10. In yet another embodiment, the first confinement layer 24 can be formed utilizing a layer transfer process.

The first confinement layer 24 that is employed in the present application has a thickness that is from 0.01 µm to 0.5 µm, with a thickness from 0.02 µm to 0.1 µm being more typical. Other thicknesses that are above and/or below that aforementioned thickness range can also be employed as the first confinement layer 24.

Figure 10:
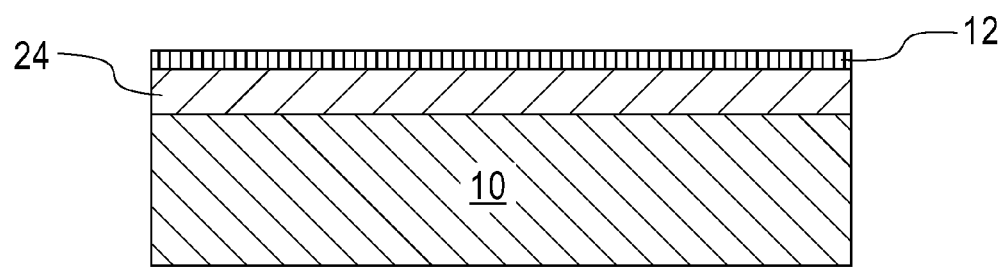
FIG. 10 is a pictorial representation (through a cross sectional view) illustrating the structure of FIG. 9 after forming a crack propagation layer on an upper surface of the first confinement layer.

Referring to FIG. 10, there is illustrated the structure of FIG. 9 after forming a crack propagation layer 12 on an upper surface of the first confinement layer 24. The crack propagation layer 12 employed in this embodiment of the present disclosure has a fracture toughness that is less than the base substrate 10, the first confinement layer 24, the second confinement layer 26 to be subsequently formed and the semiconductor device layer 14 also to be subsequently formed.

In one embodiment, the first confinement layer 24 is comprised of a semiconductor material. In such an embodiment, and when the first confinement layer 24 is comprised of AlAs, the crack propagation layer 12 can be comprised of germanium.

Figure 11:
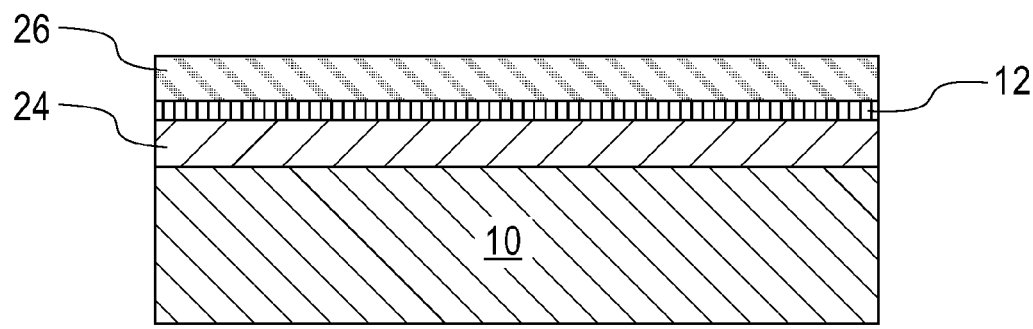
FIG. 11 is a pictorial representation (through a cross sectional view) illustrating the structure of FIG. 10 after forming a second confinement layer on an upper surface of the crack propagation layer.

Referring to FIG. 11, there is illustrated the structure of FIG. 10 after forming a second confinement layer 26 on an upper surface of the crack propagation layer 12. The second confinement layer 26 employed in the present disclosure can include one of the materials mentioned above for the first confinement layer 24 Like the first confinement layer 24, the second confinement layer 26 comprises a material having a fracture toughness that is greater than that of the crack propagation layer 12. In one embodiment, the first and second confinement layers are comprised of the same material such as, for example, AlAs. In another embodiment, the first and second confinement layers (24, 26) are comprised of different materials.

In this embodiment of the present disclosure, the combination of layers 24, 12 and 26 forms a sacrificial structure which is used to confine the crack initiation and propagation within the crack propagation layer 12.

Figure 12:
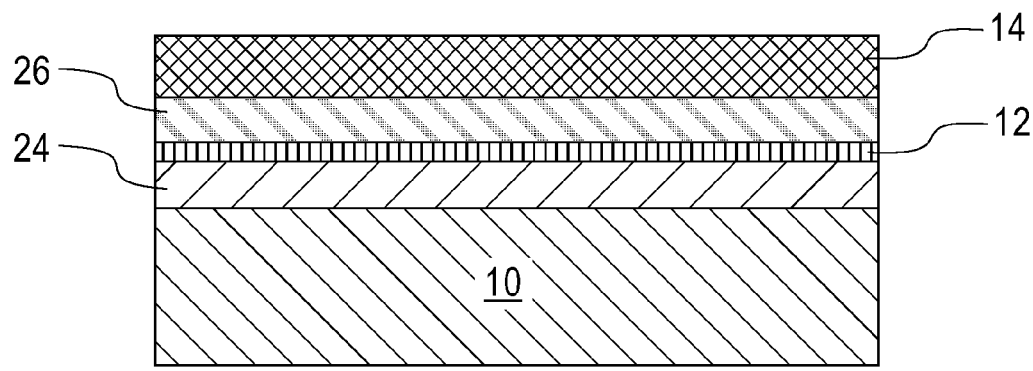
FIG. 12 is a pictorial representation (through a cross sectional view) illustrating the structure of FIG. 11 after forming a semiconductor device layer on an upper surface of the second confinement layer.

Referring to FIG. 12, there is illustrated the structure of FIG. 11 after forming a semiconductor device layer 14 on an upper surface of the second confinement layer 24. The semiconductor device layer 14 employed in this embodiment of the present disclosure is the same as described in the previous embodiment of the present disclosure which was illustrated in FIG. 3.

Figure 13:
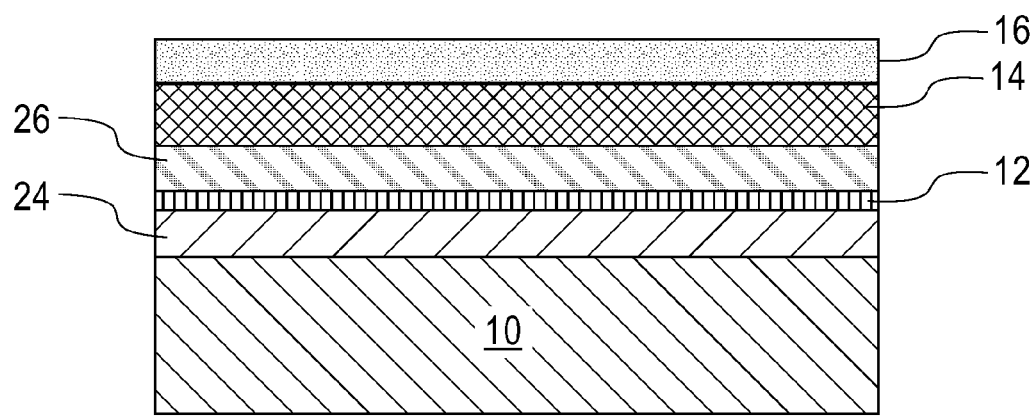
FIG. 13 is a pictorial representation (through a cross sectional view) illustrating the structure of FIG. 12 after forming a stressor layer on an upper surface of the semiconductor device layer.

Referring to FIG. 13, there is illustrated the structure of FIG. 12 after forming a stressor layer 16 on an upper surface of the semiconductor device layer 14. The stressor layer 16 employed in this embodiment of the present disclosure is the same as described in the previous embodiment of the present disclosure which was illustrated in FIG. 4.

Figure 14:
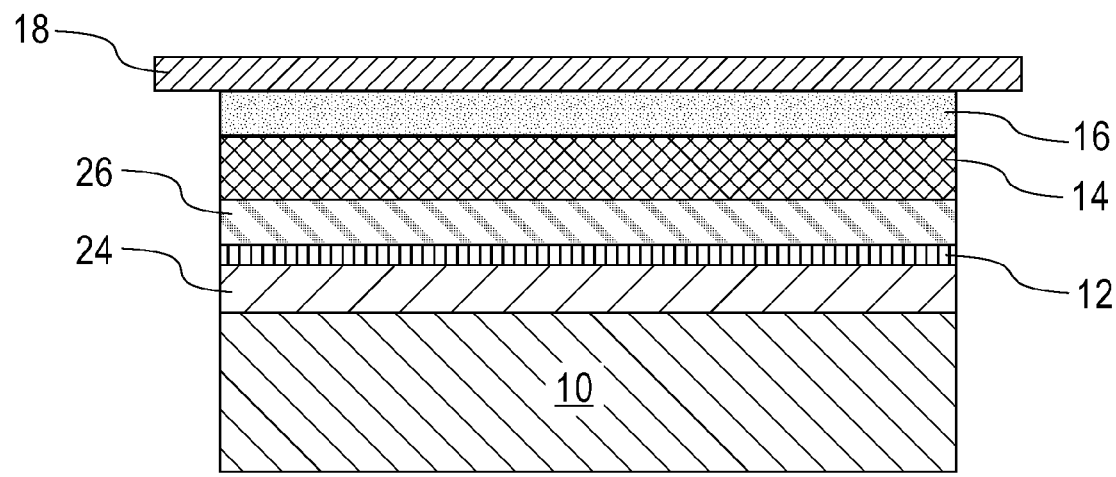
FIG. 14 is a pictorial representation (through a cross sectional view) illustrating the structure of FIG. 13 after forming a plastic sheet atop the stressor layer.

Referring to FIG. 14, there is illustrated the structure of FIG. 13 after forming a plastic sheet 18 atop the stressor layer 16. The plastic sheet 18 employed in this embodiment of the present disclosure is the same as described in the previous embodiment of the present disclosure which was illustrated in FIG. 5.

Figure 15:
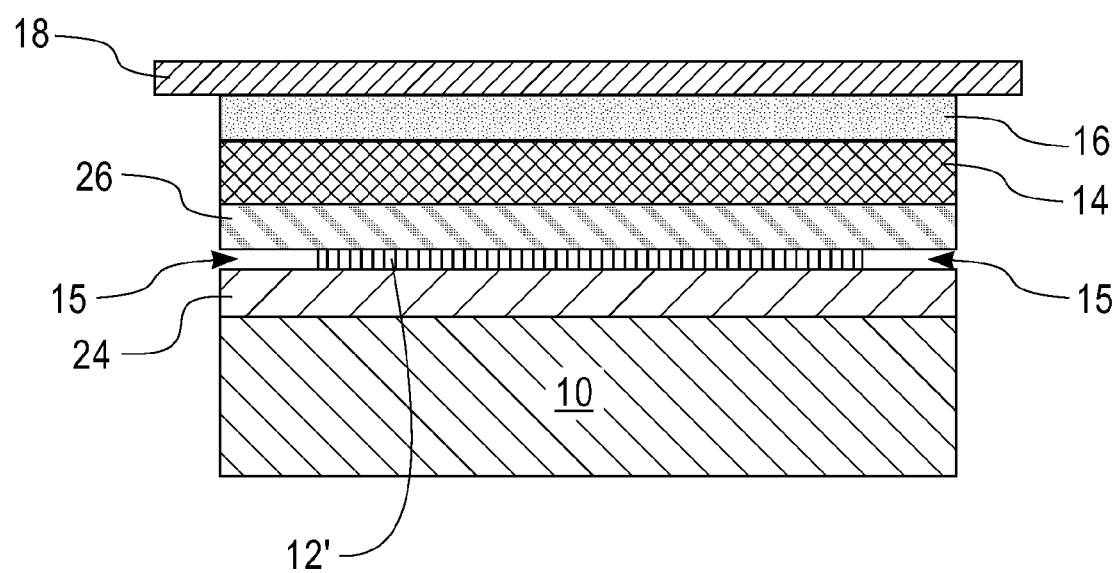
FIG. 15 is a pictorial representation (through a cross sectional view) illustrating the structure of FIG. 14 after etching the crack propagation layer to initiation crack formation in the crack propagation layer.

Referring to FIG. 15, there is illustrated the structure of FIG. 14 after etching the crack propagation layer 12 to initiation crack formation in the crack propagation layer. The etching employed in this embodiment of the present disclosure to initiate crack formation is the same as described in the previous embodiment of the present disclosure which was illustrated in FIG. 6.

Figure 16:
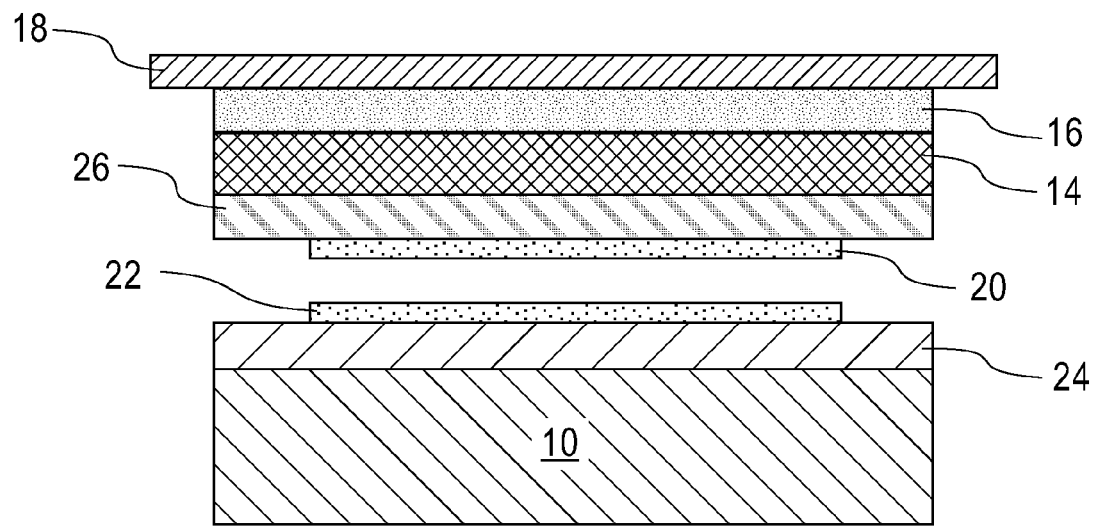
FIG. 16 is a pictorial representation (through a cross sectional view) illustrating the structure of FIG. 15 after cleaving the etched crack propagation layer to separate the semiconductor device layer from the base substrate.

Referring to FIG. 16, there is illustrated the structure of FIG. 15 after cleaving the etched crack propagation layer 12' to separate the semiconductor device layer 14 from the base substrate 10. The cleaving employed in this embodiment of the present disclosure to cleave the base substrate 10 from the semiconductor device layer 14 is the same as described in the previous embodiment of the present disclosure which was illustrated in FIG. 7.

Figure 17:
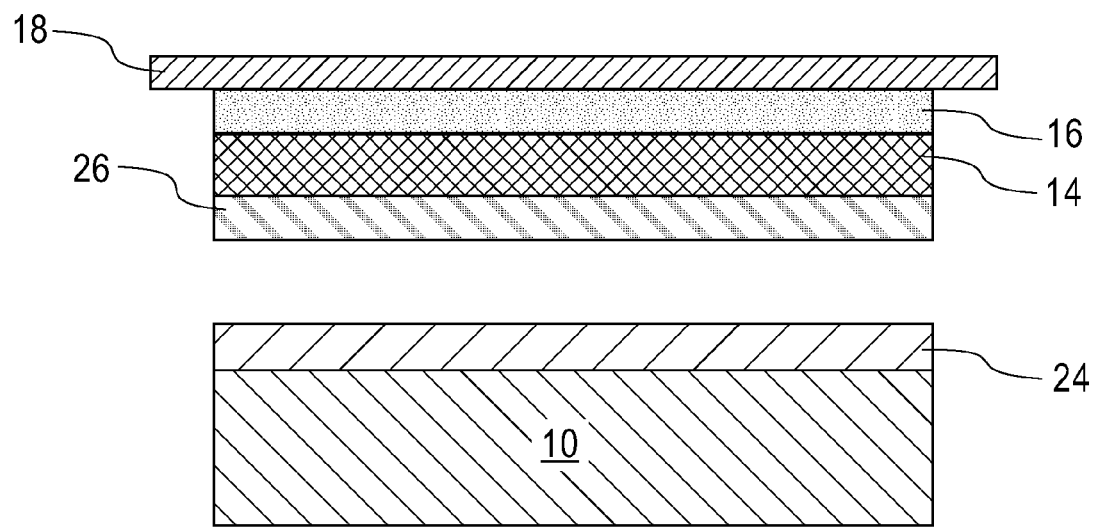
FIG. 17 is a pictorial representation (through a cross sectional view) illustrating the structure of FIG. 16 after removing the cleaved portions of the crack propagation layer that remain on both the base substrate and the semiconductor device layer.

Referring to FIG. 17, there is illustrated the structure of FIG. 16 after removing the cleaved portions of the crack propagation layer that remains on both the base substrate 10 and the semiconductor device layer 14. That is, FIG. 17 illustrates the structure of FIG. 16 after removing the cleaved crack propagation layer portions (20, 22) from the respective surfaces of the second confinement layer 26 and the first confinement layer 24. The removal of the cleaved crack propagation layer portions (20, 22) can be performed utilizing an etching process such as described above for the embodiment depicted in FIG. 8 of the present disclosure.

Figure 18:
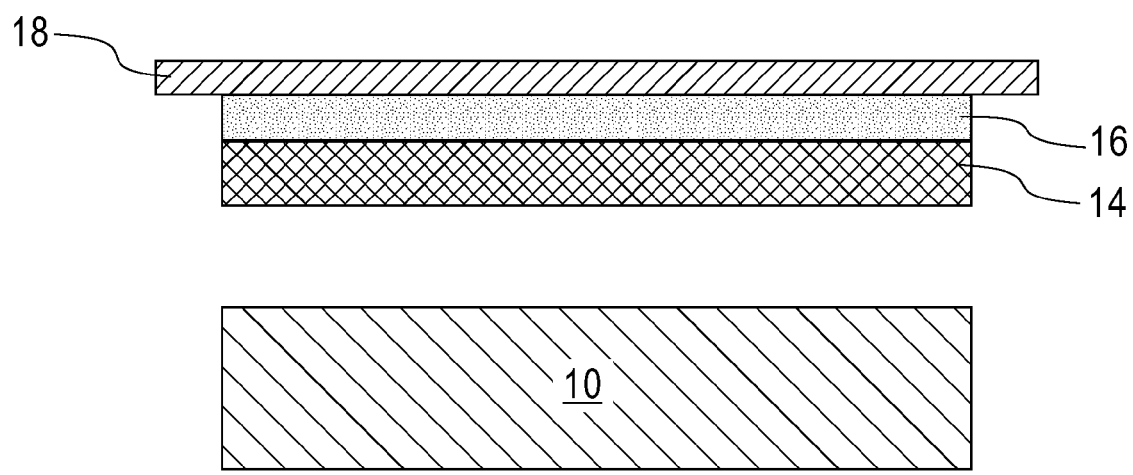
FIG. 18 is a pictorial representation (through a cross sectional view) illustrating the structure of FIG. 17 after removing the first confinement layer from the base substrate and after removing the second confinement layer from the semiconductor device layer.

Referring to FIG. 18, there is illustrated the structure of FIG. 17 after removing the first confinement layer 24 from the base substrate 10 and after removing the second confinement layer 26 from the semiconductor device layer 14. The removal of the first and second confinement layers (24, 26) from the semiconductor device layer 14 and the base substrate 10 can be performed utilizing an etching process that selectively removes the confinement layers from the respective surfaces of the semiconductor device layer 14 and the base substrate 10. In one embodiment, the etching process can include HF as an etchant.

After removing the confinement layers from the respective surfaces of the semiconductor device layer 14 and the base substrate 10, the structure including the semiconductor device layer 14 can be further processed utilizing techniques well known in the art. For example, the structure including the semiconductor device layer 14 can be transferred to a handle substrate (e.g., semiconductor substrate, glass, and/or metal sheet) and then the plastic sheet 18 and the stressor layer 16 could be removed therefrom. Alternatively, the plastic sheet 18 and the stressor layer 16 could be removed prior to transferring the semiconductor device layer 14 to the handle substrate.

After the first confinement layer 24 is removed from the upper surface of the base substrate 10, the base substrate 10 shown in FIG. 18 can be re-used as desired. It is noted that since crack initiation and propagation occurred in the crack propagation layer 12, not the base substrate, the base substrate 10 shown in FIG. 18 has a flat, planar surface. This is in contrast to conventional spalling disclosed in U.S. Patent Application No. 2010/0311250 to Bedell et al.

While the present disclosure has been particularly shown and described with respective to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A method of removing a semiconductor device layer from a base substrate, said method comprising:
   providing a crack propagation layer on an upper surface of a base substrate;

providing a semiconductor device layer including at least one semiconductor device on the crack propagation layer, wherein said at least one semiconductor device is formed on said semiconductor layer prior to forming said semiconductor layer on said crack propagation layer;

depositing a metal-containing adhesion layer on an upper surface of the semiconductor device layer;

forming a stressor layer containing a metal on an upper surface of the metal-containing adhesion layer;

applying a plastic sheet atop the stressor layer;

etching end portions of the crack propagation layer to initiate a crack in the crack propagation layer;

cleaving the etched crack propagation layer to provide a cleaved crack propagation layer portion to a surface of the semiconductor device layer and another cleaved crack propagation layer portion to the upper surface of the base substrate;

removing the cleaved crack propagation layer portion from the surface of the semiconductor device layer and the another cleaved crack propagation layer portion from the upper surface of the base substrate; and removing said stressor layer and said plastic sheet from atop said semiconductor device layer after said cleaving.

2. The method of claim 1, wherein the crack propagation layer includes a material that has a fracture toughness that is less than the base substrate and less than the semiconductor device layer.

3. The method of claim 2, wherein said material of the crack propagation layer comprises a semiconductor material.

4. The method of claim 3, wherein said semiconductor material comprises germanium or AlAs.

5. The method of claim 2, wherein the base substrate is a semiconductor material, glass or a ceramic.

6. The method of claim 1, wherein said etching is performed in a bath including at least one etchant.

7. The method of claim 1, wherein said cleaving is performed at a temperature from room temperature to less than room temperature.

8. The method of claim 1, wherein said removing the cleaved crack propagation layer portion and the another cleaved crack propagation layer portion comprises an etching process.

9. The method of claim 1, wherein said semiconductor device layer comprises at least one semiconductor device formed thereon, said at least one semiconductor device is formed after said forming the semiconductor device layer.

10. The method of claim 1, wherein said plastic sheet has outer edges that extend beyond outer edges of said base substrate, said crack propagation layer, said semiconductor device layer and said stressor layer.

11. The method of claim 1, wherein said cleaving comprises spalling.

12. The method of claim 1, wherein said stressor layer comprises Ni.

13. The method of claim 1, wherein said plastic sheet is a thermoplastic polymer.

14. The method of claim 1, wherein said plastic sheet is a thermosetting polymer.

15. The method of claim 1, wherein said applying the plastic sheet is by hand

16. A method of removing a semiconductor device layer from a base substrate, said method comprising:

providing a crack propagation layer on an upper surface of a base substrate;

forming a semiconductor device layer including at least one semiconductor device on the crack propagation layer;

depositing a metal-containing adhesion layer containing at least one material selected from the group consisting of Ti/W, Ti and Cr on an upper surface of the semiconductor device layer;

forming a layer of Ni on an upper surface of the metal-containing adhesion layer;

applying a plastic sheet atop the layer of Ni;

etching end portions of the crack propagation layer to initiate a crack in the crack propagation layer;

cleaving the etched crack propagation layer to provide a cleaved crack propagation layer portion to a surface of the semiconductor device layer and another cleaved crack propagation layer portion to the upper surface of the base substrate;

removing the cleaved crack propagation layer portion from the surface of the semiconductor device layer and the another cleaved crack propagation layer portion from the upper surface of the base substrate; and removing said layer of Ni and said plastic sheet from atop said semiconductor device layer after said cleaving.

17. The method of claim 16, wherein said plastic sheet has outer edges that extend beyond outer edges of said base substrate, said crack propagation layer, said semiconductor device layer and said stressor layer.

* * * * *